(12) United States Patent
Nakagawa et al.

(10) Patent No.: US 7,256,718 B2
(45) Date of Patent: Aug. 14, 2007

(54) MODULATION APPARATUS AND METHOD

(75) Inventors: Toshiyuki Nakagawa, Kanagawa (JP); Hiroshige Okamura, Chiba (JP); Minoru Tobita, Tokyo (JP)

(73) Assignee: Sony Corporation, Tokyo (JP)

( * ) Notice: Subject to any disclaimer, the term of this patent is extended or adjusted under 35 U.S.C. 154(b) by 611 days.

(21) Appl. No.: 10/469,691

(22) PCT Filed: Jan. 15, 2003

(86) PCT No.: PCT/JP03/00236

§ 371 (c)(1),
(2), (4) Date: Feb. 10, 2004

(87) PCT Pub. No.: WO03/060912

PCT Pub. Date: Jul. 24, 2003

(65) Prior Publication Data

US 2004/0130467 A1 Jul. 8, 2004

(30) Foreign Application Priority Data

Jan. 16, 2002 (JP) ............................. 2002-007254

(51) Int. Cl.
*H03M 7/00* (2006.01)
(52) U.S. Cl. ........................ 341/59; 341/58; 341/68; 375/253
(58) Field of Classification Search ............ 341/58–59
See application file for complete search history.

(56) References Cited

U.S. PATENT DOCUMENTS

| | | | | |
|---|---|---|---|---|
| 5,506,581 A | * | 4/1996 | Ino et al. ...................... | 341/58 |
| 6,172,622 B1 | * | 1/2001 | Nakagawa et al. ............ | 341/59 |
| 6,496,541 B1 | * | 12/2002 | Kahlman et al. ............. | 375/253 |
| 6,577,255 B2 | * | 6/2003 | Hayami et al. ............... | 341/59 |

FOREIGN PATENT DOCUMENTS

| | | |
|---|---|---|
| JP | 2000-11551 | 1/2000 |
| JP | 2000-149457 | 5/2000 |
| JP | 2003-60511 | 2/2003 |

* cited by examiner

*Primary Examiner*—Khai M. Nguyen
(74) *Attorney, Agent, or Firm*—Oblon, Spivak, McClelland, Maier & Neustadt, P.C.

(57) ABSTRACT

The present invention pertains to a modulation apparatus and method in which the modulation apparatus is realized with a simple circuit structure and is easily applicable to other systems. A pattern conversion unit 32 converts data having a basic data length of 2 bits supplied from a DSV control bit determination and insertion unit 31 into a variable-length code having a basic code length of 3 bits in accordance with a conversion table. A minimum-run-length limitation code detection unit 33 detects, from a data sequence containing a DSV control bit, the position of minimum runs consecutive from a channel bit string converted by the pattern conversion unit 32. A consecutive-minimum-run replacement unit 34 replaces a predetermined portion of the channel bit string supplied from the pattern conversion unit 32 for a predetermined pattern based on the position information supplied from the minimum-run-length limitation code detection unit 33, and limits the minimum run length to a predetermined number or less. The present invention is applicable to a modulation apparatus.

15 Claims, 11 Drawing Sheets

MODULATION APPARATUS AND METHOD

RELATED APPLICATION

This application is a 371 of PCT/JP03/00236 filed Jan. 15, 2003 which claims priority to Japanese Application No. 2002-007254 filed Feb. 16, 2002.

TECHNICAL FIELD

The present invention relates to a modulation apparatus and method, and particularly to a modulation apparatus and method suitable for data transmission or recording onto recording media.

BACKGROUND ART

For transmission of data over a predetermined transmission path or recording of data onto recording media such as magnetic discs, optical discs, and magneto-optical discs, the data is modulated so as to become compatible with the transmission path or the recording media. One known modulation method is block coding. In block coding, a data sequence is divided into blocks of m×i bits (the blocks are hereinafter referred to as data words) and each data word is converted into a codeword of n×i bits in accordance with an appropriate coding rule. If i=1, the code is a fixed-length code. If a plurality of i's are selectable or if conversion is performed using a predetermined i selected from a range of 1 to imax (maximum i), the code is a variable-length code. The block-coded code is expressed as a variable-length code (d, k; m, n; r).

As used herein, i is referred to as the constraint length; imax corresponds to r (maximum constraint length); d indicates the minimum number of consecutive "0's" that are inserted between consecutive "1's", e.g., the minimum run length of "0"; and k indicates the maximum number of consecutive "0's" that are inserted between consecutive "1's", e.g., the maximum run length of "0".

When the thus obtained variable-length code is recorded onto an optical disc, a magneto-optical disc, or the like, for example, in the case of a compact disc or mini disk, the variable-length code is subjected to NRZI (Non Return to Zero Inverted) modulation in which "1" is inverted and "0" is not inverted, and recording is performed based on the NRZI-modulated variable-length code (hereinafter also referred to as a recording waveform string). In the initial ISO (International Organization for Standardization) compatible magneto-optical discs having relatively low recording density, modulated recording bit strings which were not subjected to NRZI modulation were recorded.

Assuming that the minimum inversion interval of the recording waveform string is indicated by Tmin and the maximum inversion interval of the recording waveform string is indicated by Tmax, a longer minimum inversion interval Tmin or greater minimum run length d is desirable for high-density recording in the linear velocity direction, and a shorter maximum inversion interval Tmax or smaller maximum run length k is desirable in view of clock playback. A variety of modulation methods meeting these conditions have been proposed.

Specific modulation methods proposed or actually used in, for example, optical discs, magnetic discs, magneto-optical discs, and the like include a variable-length RLL (1-7) (also expressed as (1, 7; m, n; r)) code or RLL (2-7) (also expressed as (2, 7; m, n; r)) code, and a fixed-length RLL (1-7) (also expressed as (1, 7; m, n; 1)) code for use in ISO-compatible MO discs. High-recording-density disc devices such as optical discs and magneto-optical discs which are being developed and studied often use RLL codes (Run Length Limited codes) with minimum run length d=1.

An example conversion table of the variable-length RLL (1-7) code is shown as follows:

TABLE 1

| RLL(1, 7; 2, 3; 2) | | |
|---|---|---|
| | Data | Code |
| i = 1 | 11 | 00x |
| | 10 | 010 |
| | 01 | 10x |
| i = 2 | 0011 | 000 00x |
| | 0010 | 000 010 |
| | 0001 | 100 00x |
| | 0000 | 100 010 |

In this conversion table, symbol x corresponds to "1" when the subsequent channel bit is "0", and corresponds to "0" when the subsequent channel bit is "1". The maximum constraint length r is 2.

The parameters of the variable-length RLL (1-7) are (1, 7; 2, 3; 2). If the bit interval of the recording waveform string is indicated by T, the minimum inversion interval Tmin expressed by (d+1) T is equal to 2 (=1+1) T. Assuming that the bit interval of the data sequence is indicated by Tdata, then the minimum inversion interval Tmin given by (m/n)×2 is equal to 1.33 (=(⅔)×2) Tdata. The maximum inversion interval Tmax given by (k+1) T is equal to 8 (=7+1) T (=(m/n)×8 Tdata=(⅔)×8 Tdata=5.33 Tdata). The detection window margin Tw is expressed by (m/n)×Tdata, the value thereof being equal to 0.67 (=⅔) Tdata.

In the channel bit strings modulated in accordance with the RLL (1-7) coding shown in Table 1, 2T, namely, Tmin, occurs most frequently, followed by 3T and 4T. In most cases, frequent occurrence of edge information with a short period, such as 2T or 3T, is favorable to clock playback.

In contrast, when the recording density in the linear velocity direction becomes higher, a problem with Tmin arises. Specifically, when the minimum run length, namely, 2T, occurs consecutively, the recording waveform is easily distorted because the waveform output of 2T is smaller than other waveform outputs and is susceptible to, for example, noise, defocusing, tangential tilt, or the like.

For high linear density recording, therefore, recording with consecutive Tmin (2T) is sensitive to disturbance such as noise, and this may lead to errors during data playback. In such a case, data playback errors are often caused by simultaneous shift of the leading edge and the trailing edge of the consecutive Tmin (2T). In other words, the bit error length becomes longer.

In recording data onto recording media or transmitting data, the data is modulated in accordance with a coding scheme compatible with the recording media or transmission path. If the modulated code contains a direct-current component, fluctuation or jitter may be caused in various error signals, such as for tracking error in servo control of a disc device. Therefore, it is desirable that the modulated code contains few direct-current components.

Accordingly, DSV (Digital Sum Value) control has been proposed. DSV is the sum of bits of an NRZI-modulated (namely, level-coded) channel bit string by allocating +1 to the bit string (symbol of the data) set to "1" and −1 to the bit string set to "0". Reducing the absolute value of DSV, which is a measure of a direct-current component of the code string, that is, performing DSV control, enables suppression of the direct-current component of the code string.

The codes modulated in accordance with the variable-length RLL (1-7) table shown in Table 1 are not subjected to DSV control. DSV control is realized by determining the DSV of the modulated code string (channel bit string) at predetermined intervals and inserting predetermined DSV control bits in the code string (channel bit string).

Basically, the DSV control bits are redundant bits. In view of code conversion efficiency, the fewer the DSV control bits, the better.

Desirably, the inserted DSV control bits do not cause changes in the minimum run length d and the maximum run length k. Changes of (d, k) affect recording and playback characteristics.

Actually, the RLL code must meet the minimum run length requirement, although the maximum run length requirement is not necessarily met. There are some formats in which patterns exceeding the maximum run length are used for a synchronization signal. For example, the 8-16 code for use in DVDs (Digital Versatile Disks) has a maximum run length of 11T, but gives 14T, exceeding the maximum run length, to the synchronization signal pattern portion in order to enhance the detection performance of the synchronization signal.

Accordingly, in the RLL (1-7) coding with improved conversion efficiency, for supporting high density recording, it is important to control the minimum run length so that it becomes more suitable for high linear density and to perform DSV control as efficiently as possible.

For example, Japanese Unexamined Patent Application Publication No. 11-177431, filed by the present applicant, discloses a modulation apparatus including DSV control bit insertion means for inserting a first DSV control bit in a data sequence to generate a first data sequence and for inserting a second DSV control bit in the data sequence to generate a second data sequence; modulation means for modulating both the first data sequence and the second data sequence using a conversion table in which the minimum run length d is 1 and the remainder of the number of "1's" in each element of a data sequence divided by two and the remainder of the number of "1's" in each element of a converted codeword string divided by two are equally 1 or 0; and DSV calculation means for determining a first sectional DSV of the first data sequence modulated using the conversion table and a second sectional DSV of the second data sequence modulated using the conversion table so that the determined sectional DSVs are added to the DSV up to the present position and for selecting and outputting, from the resulting DSV, one of the first data sequence and second data sequence modulated using the conversion table.

FIG. 1 is a block diagram showing the structure of a modulation apparatus of the related art.

As shown in FIG. 1, a modulation apparatus 10 includes a DSV bit insertion unit 11 for inserting "1" or "0", serving as a DSV bit, into an input data sequence at predetermined intervals. The DSV bit insertion unit 11 has a data sequence containing the DSV bit "1" and another data sequence containing the DSV bit "0". A modulation unit 12 modulates the data sequence in which the DSV bit is inserted by the DSV bit insertion unit 11. A DSV control unit 13 NRZI-modulates the codeword strings modulated by the modulation unit 12 to obtain level data, determines the DSV of the level data, and finally outputs a DSV-controlled recording code string.

As another example, Japanese Unexamined Patent Application Publication No. 11-346154, filed by the present applicant, discloses a conversion table including, as a conversion code, a basic code where d=1, k=7, m=2, and n=3; a coding rule that the remainder of the number of "1's" in each element of a data sequence divided by two and the remainder of the number of "1's" in each element of a converted codeword string divided by two are equally 1 or 0; a first replacement code for limiting the minimum run length d to a predetermined number or less; and a second replacement code for meeting the run length limitations.

FIG. 2 is a block diagram showing the structure of another modulation apparatus of the related art.

As shown in FIG. 2, a modulation apparatus 20 includes a DSV control bit determination and insertion unit 21 for determining a DSV control bit "1"0 or "0" and for inserting the DSV control bit into an input data sequence at predetermined intervals; a modulation unit 22 for modulating the data sequence containing the DSV control bit; and an NRZI unit 23 for converting the output of the modulation unit 22 into a recording waveform string. The modulation apparatus 20 further includes a timing management unit 24 for generating a timing signal and supplying the timing signal to the parts to manage the timing.

One problem is that the circuit structure of the above-described modulation apparatus is complicated. Another problem is that the complicated circuit structure makes it difficult to apply the apparatus to other systems.

DISCLOSURE OF INVENTION

The present invention has been made in view of such a situation, and is intended to provide a modulation apparatus having a simple circuit structure so that the modulation apparatus can be easily applied to other systems.

A modulation apparatus of the present invention includes conversion means for converting input data into codewords in accordance with a conversion table containing conversion codes having a coding rule that the remainder of the number of "1's" in each element of the data sequence divided by two and the remainder of the number of "1's" of each element of the converted codeword string divided by two are equally 1 or 0; minimum-run-length limitation code detection means for detecting a minimum-run-length limitation code from the input data, the minimum-run-length limitation code being contained in the conversion codes of the conversion table and limiting the minimum run length to a predetermined number or less; and consecutive-minimum-run replacement means for replacing the codeword string converted by the conversion means so that the minimum run length is limited to the predetermined number or less based on the minimum-run-length limitation code detected by the minimum-run-length limitation code detection means.

The modulation apparatus can further include modulation information storage means for counting the number of conversions performed by the conversion means based on a specified conversion code of the conversion codes contained in the conversion table and for storing information indicating the conversion count. The minimum-run-length limitation code detection means can be controlled to detect the minimum-run-length limitation code from the input data based on the information stored by the modulation information storage means.

The modulation apparatus can further include synchronization signal insertion means for inserting a synchronization signal containing a unique pattern, which does not exist as a conversion code of the conversion table, at an arbitrary position into the codeword string whose minimum run length is limited to the predetermined number or less by the consecutive-minimum-run replacement means; and NRZI conversion means for NRZI-converting the codeword string in which the synchronization signal is inserted by the synchronization signal insertion means to generate a recording code string.

The conversion means can include conversion code detection means for detecting a predetermined pattern from the input data, the predetermined pattern being contained in the conversion codes of the conversion table having a basic code wherein d=1, k=7, m=2, and n=3; termination code detection means for detecting a termination code from the input data, the termination code being contained in the conversion codes of the conversion table and terminating a code at an arbitrary position; undefined code detection means for detecting an undefined code from the input data, the undefined code being contained in the conversion codes of the conversion table and containing an undefined code including an undefined character having character "*0*" which becomes "000" or "101", where * denotes "0" if the previous or subsequent codeword is "1" and denotes "1" if the previous or subsequent codeword is "0"; undefined bit determination means for determining a value of the symbol * of the undefined character contained in the undefined code detected by the undefined code detection means; and conversion pattern determination means for determining the conversion code of the conversion table to be used, based on the detection results of the conversion code detection means, the termination code detection means, and the undefined code detection means, and the value determined by the undefined bit determination means.

The termination code detection means can include a termination position counter which supplies information for specifying the termination position. The termination code detection means can detect a predetermined pattern contained in the conversion codes of the conversion table from the input data, and can determine that the termination code is detected when the information supplied from the termination position counter indicates the termination position.

The undefined code detection means can acquire information indicating the last bit of the conversion pattern determined by the conversion pattern determination means and information indicating the last bit of pattern of the synchronization signal inserted by the synchronization signal insertion means. The undefined bit determination means can determine the value of the symbol * of the undefined character based on the information indicating the last bit of the conversion pattern and the information indicating the last bit of the pattern of the synchronization signal acquired by the undefined code detection means.

The conversion pattern determination means can determine, based on the termination code, whether or not the conversion pattern in accordance with which the input data sequence is converted is determined. Based on the determination result of the conversion pattern determination means, the synchronization signal insertion means can insert the synchronization signal which is subjected to predetermined processing into the codeword string at an arbitrary position.

In the predetermined processing, the start bit of the synchronization signal can be set to "1" if the conversion pattern determination means determines, based on the termination code, that the conversion pattern is determined, and the start bit of the synchronization signal can be set to "0" if the conversion pattern determination means determines, based on the termination code, that the conversion pattern is not determined.

A modulation method of the present invention includes a conversion step of converting input data into codewords in accordance with a conversion table containing conversion codes having a coding rule that the remainder of the number of "1's" in each element of the data sequence divided by two and the remainder of the number of "1's" in each element of the converted codeword string divided by two are equally 1 or 0; a minimum-run-length limitation code detection step of detecting a minimum-run-length limitation code from the input data, the minimum-run-length limitation code being contained in the conversion codes of the conversion table and limiting the minimum run length to a predetermined number or less; and a consecutive-minimum-run replacement step of replacing the codeword string converted by performing the conversion step so that the minimum run length is limited to the predetermined number or less based on the minimum-run-length detected by performing the minimum-run-length limitation code detection step.

The modulation method can further include a modulation information storage step of counting the number of conversions performed in the conversion step based on a specified conversion code of the conversion codes contained in the conversion table and controlling storage of information indicating the conversion count. In the minimum-run-length limitation code detection step, detection of the minimum-run-length limitation code from the input data can be controlled based on the information stored by performing the modulation information storage step.

The modulation method can further include a synchronization signal insertion step of inserting a synchronization signal containing a unique pattern, which does not exist as a conversion code of the conversion table, at an arbitrary position into the codeword string whose minimum run length is limited to the predetermined number or less by performing the consecutive-minimum-run replacement step; and an NRZI conversion step of NRZI-converting the codeword string in which the synchronization signal is inserted by performing the sync signal insertion step to generate a recording code string.

The conversion step can include a conversion code detection step of detecting a predetermined pattern from the input data, the predetermined pattern being contained in the conversion codes of the conversion table having a basic code wherein d=1, k=7, m=2, and n=3; a termination code detection step of detecting a termination code from the input data, the termination code being contained in the conversion codes of the conversion table and terminating a code at an arbitrary position; an undefined code detection step of detecting an undefined code from the input data, the undefined code being contained in the conversion codes of the conversion table and containing an undefined code including an undefined character having character "*0*" which becomes "000" or "101", where * denotes "0" if the previous or subsequent codeword is "1" and denotes "1" if the previous or subsequent codeword is "0"; an undefined bit determination step of determining a value of the symbol * of the undefined character contained in the undefined code detected by performing the undefined code detection step; and a conversion pattern determination step of determining the conversion code of the conversion table to be used, based on the detection results obtained by performing the conversion code detection step, the termination code detection step, and the undefined code detection step, and the value determined by performing the undefined bit determination step.

The modulation method for the modulation apparatus including a termination position counter which supplies information for specifying the termination position can be designed such that, in the termination code detection step, a predetermined pattern contained in the conversion codes of the conversion table is detected from the input data and it is determined that the termination code is detected when the information supplied from the termination position counter indicates the termination position.

The undefined code detection step can include controlling acquisition of information indicating the last bit of the conversion pattern determined by performing the conversion pattern determination step and information indicating the last bit of the pattern of the synchronization signal inserted by performing the synchronization signal insertion step. The undefined bit determination step can include determining the value of the symbol * of the undefined character based on the information indicating the last bit of the conversion pattern and the information indicating the last bit of the pattern of the synchronization signal acquired by performing the undefined code detection step.

In the conversion pattern determination step, it can be determined, based on the termination code, whether or not the conversion pattern in accordance with which the input data string is converted is determined. In the synchronization signal insertion step, based on the determination result obtained by performing the conversion pattern determination step, the synchronization signal which is subjected to predetermined processing can be inserted into the codeword string at an arbitrary position.

In the predetermined processing, the start bit of the synchronization signal can be set to "1" if the conversion pattern determination step determines, based on the termination code, that the conversion pattern is determined, and the start bit of the synchronization signal can be set to "0" if the conversion pattern determination step determines, based on the termination code, that the conversion pattern is not determined.

A program of a recording medium of the present invention includes a conversion step of converting input data into codewords in accordance with a conversion table containing conversion codes having a coding rule that the remainder of the number of "1's" in each element of the data sequence divided by two and the remainder of the number of "1's" in each element of the converted codeword string divided by two are equally 1 or 0; a minimum-run-length limitation code detection step of detecting a minimum-run-length limitation code from the input data, the minimum-run-length limitation code being contained in the conversion codes of the conversion table and limiting the minimum run length to a predetermined number or less; and a consecutive-minimum-run replacement step of replacing the codeword string converted by performing the conversion step so that the minimum run length is limited to the predetermined number or less based on the minimum-run-length limitation code detected by performing the minimum-run-length limitation code detection step.

A program of the present invention causes a computer to execute a conversion step of converting input data into codewords in accordance with a conversion table containing conversion codes having a coding rule that the remainder of the number of "1's" in each element of the data sequence divided by two and the remainder of the number of "1's" in each element of the converted codeword string divided by two are equally 1 or 0; a minimum-run-length limitation code detection step of detecting a minimum-run-length limitation code from the input data, the minimum-run-length limitation code being contained in the conversion codes of the conversion table and limiting the minimum run length to a predetermined number or less; and a consecutive-minimum-run replacement step of replacing the codeword string converted by performing the conversion step so that the minimum run length is limited to the predetermined number or less based on the minimum-run-length limitation code detected by performing the minimum-run-length limitation code detection step.

In the modulation apparatus and method, and program of the present invention, input data is converted into codewords in accordance with a conversion table containing conversion codes having a coding rule that the remainder of the number of "1's" in an element of the data sequence divided by two and the remainder of the number of "1's" in an element of the converted codeword string divided by two are equally 1 or 0; a minimum-run-length limitation code contained in the conversion codes of the conversion table for limiting the minimum run length to a predetermined number or less is detected from the input data; and the codeword string into which the input data is converted is replaced so that the minimum run length is limited to the predetermined number or less based on the detected minimum-run-length limitation code.

BEST MODE FOR CARRYING OUT THE INVENTION

Figure 1:
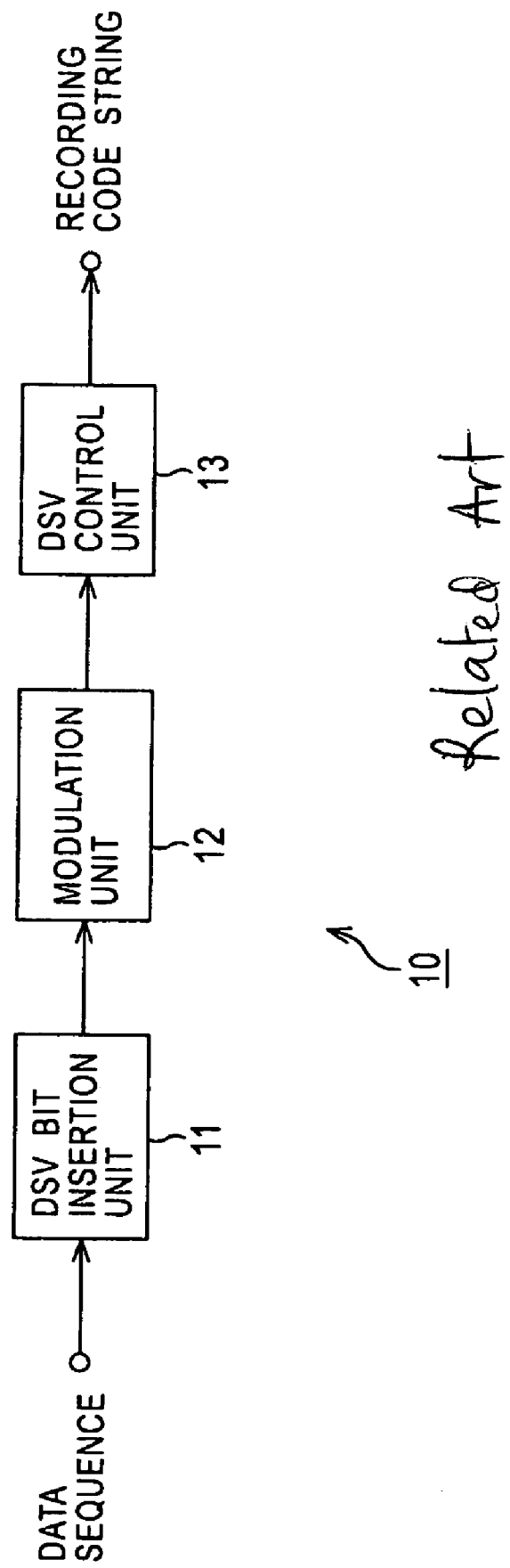
FIG. 1 is a block diagram showing an example structure of a modulation apparatus of the related art.
Figure 2:
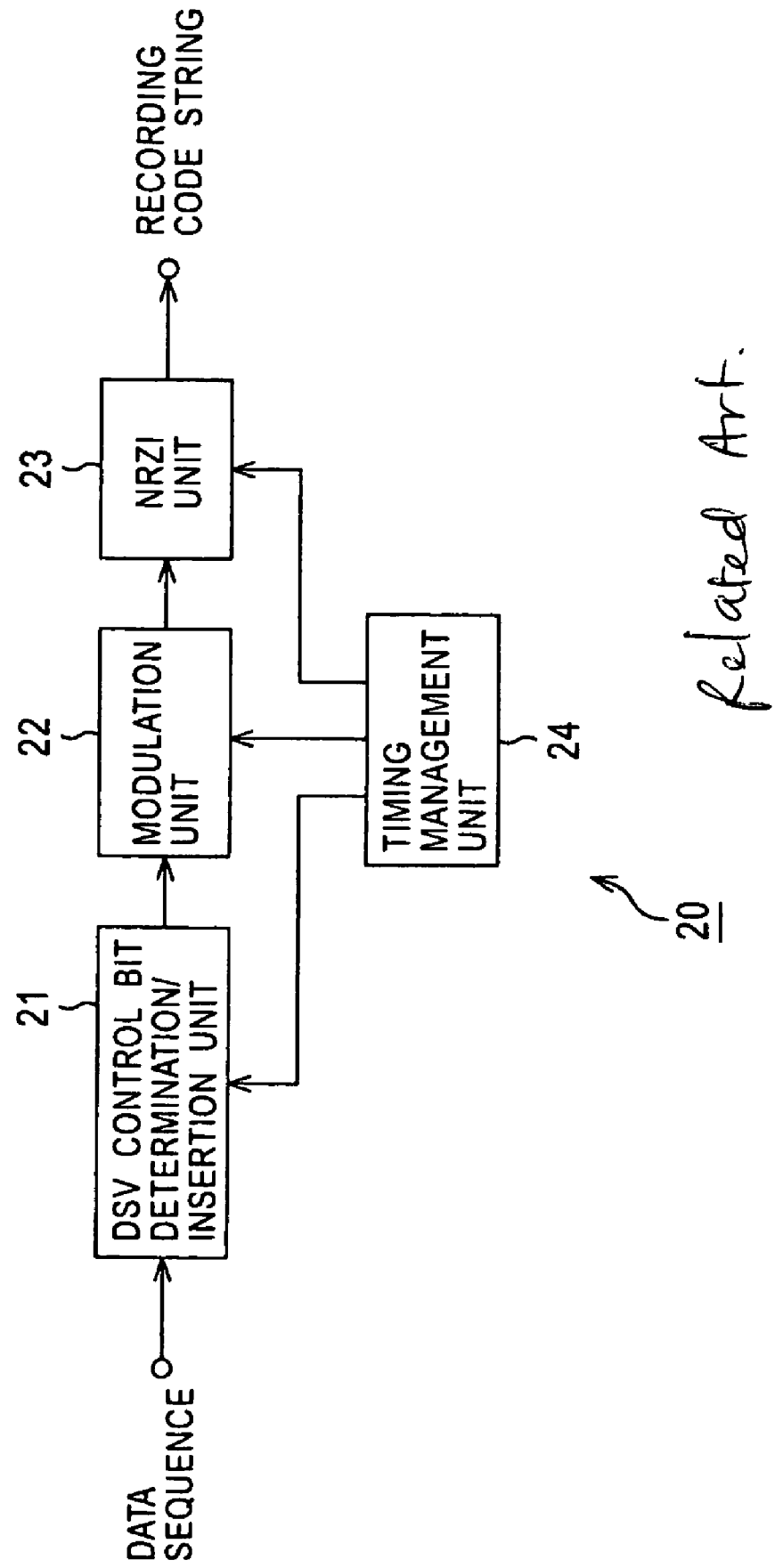
FIG. 2 is a block diagram showing an example structure of another modulation apparatus of the related art.

An embodiment of the present invention is described below. In the following description, for convenience of illustration, a stream of "0's" and "1's" of unconverted data (unconverted data sequence) is enclosed within parentheses, e.g., (000011), and a stream of "0's" and "1's" of converted code (codeword string) is enclosed within quotation marks, e.g., "000100100". Table 2 is an example conversion table of the present invention for converting data into code.

TABLE 2

1,7PP_table
(d, k; m, n; r) = (1, 7; 2, 3; 4)

| Dataword | | | | Codeword | | | |
|---|---|---|---|---|---|---|---|
| 11 | | | | *0* (Before 0:* = 1, Before 1:* = 0) | | | |
| 10 | | | | 001 | | | |
| 01 | | | | 010 | | | |
| 0011 | | | | 010 | 100 | | |
| 0010 | | | | 010 | 000 | | |
| 0001 | | | | 000 | 100 | | |
| 000011 | | 000 | | 100 | 100 | | |
| 000001 | | 010 | | 100 | 100 | | |
| 00001000 | 000 | 100 | | 100 | 100 | | |
| 00001001 | 000 | 100 | | 000 | 010 | | |
| 00001010 | 000 | 100 | | 000 | 001 | | |
| 00001011 | 000 | 100 | | 000 | 101 | | |
| 00000000 | 010 | 100 | | 100 | 100 | | |
| 00000001 | 010 | 100 | | 000 | 010 | | |
| 00000010 | 010 | 100 | | 000 | 001 | | |
| 00000011 | 010 | 100 | | 000 | 101 | | |

110111-01 :
001 :        101    010    101    →    001    000    000
00000:       000    010    101           (cbit replace)
0000t:

Termination table

| 00 | | | 000 | |
| 0000 | | 010 | 100 | |
| 000010 | 000 | 100 | 000 | |
| 000000 | 010 | 000 | 000 | |

The conversion table shown in Table 2 is a variable-length table in which the minimum run length d=1, the maximum run length k=7, the data-to-channel-bit conversion ratio m:n=2:3, and the maximum constraint length r=4. This conversion table includes, as conversion codes, a basic code essential to conversion (code of data sequences (11) to (00000011)) and a replacement code which is not essential to conversion but is effective for conversion (code of data sequence (110111)), and a termination table formed of termination code (code of data sequences (00), (0000), (000010), and (000000)) for terminating a code at an arbitrary position. In the conversion table, a synchronization signal is also specified.

In Table 2, an element of the basic code further includes an undefined code (a code containing symbol *) The undefined code is set to "0" or "1" so as to meet the requirement of the minimum run length d and the maximum run length k, whatever the previous or subsequent codeword string is. In Table 2, when a 2-bit data sequence to be converted is (11), the 2-bit data sequence is converted into either "000" or "101" depending upon the previous codeword string. If 1 channel bit of the previous codeword string is set to "1", the 2-bit data (11) is converted into the codeword "000" in order to meet the requirement of the minimum run length d. If 1 channel bit of the previous codeword string is set to "0", the 2-bit data (11) is converted into the codeword "101" in order to meet the requirement of the maximum run length k.

The conversion table shown in Table 2 also includes a replacement code for limiting the minimum run length. If the data sequence is (110111), followed by data sequence (01), (001), or (00000), or when the data sequence (110111) is followed by data sequence (0000) and terminates, then the data sequence (110111) is replaced by the codeword "001000000". If the data sequence (110111) is not followed by any of the above-noted data sequences, the data sequence (110111) is encoded in units of 2 bits ((11), (01), (11)) and is converted into the codeword string "101010101" or "000010101".

The conversion code of Table 2 has a coding rule that the remainder of the number of "1's" in each element of the data sequence divided by two and the remainder of the number of "1's" in each element of the converted codeword string divided by two are equally 1 or 0 (the corresponding elements have an odd- or even-number of "1's"). For example, the data sequence element (000001) in the conversion code corresponds to the codeword string element "010100100", where the number of "1's" in the data sequence element is one and the number of "1's" in the corresponding codeword string element is three. The remainders of the number of "1's" in both elements divided by two are equally 1 (odd number). Likewise, the data sequence element (00000000) in the conversion code corresponds to the codeword string element "010100100100", where the number of "1's" in the data sequence element is zero and the number of "1's" in the corresponding codeword string element is four. The remainders of the number of "1's" in both elements divided by two are equally 0 (even number).

An embodiment of the modulation apparatus according to the present invention is described with reference to FIG. 3. In this embodiment, a data sequence is converted into variable-length code (d, k; m, n; r)=(1, 7; 2, 3; 4) in accordance with Table 2.

Figure 3:
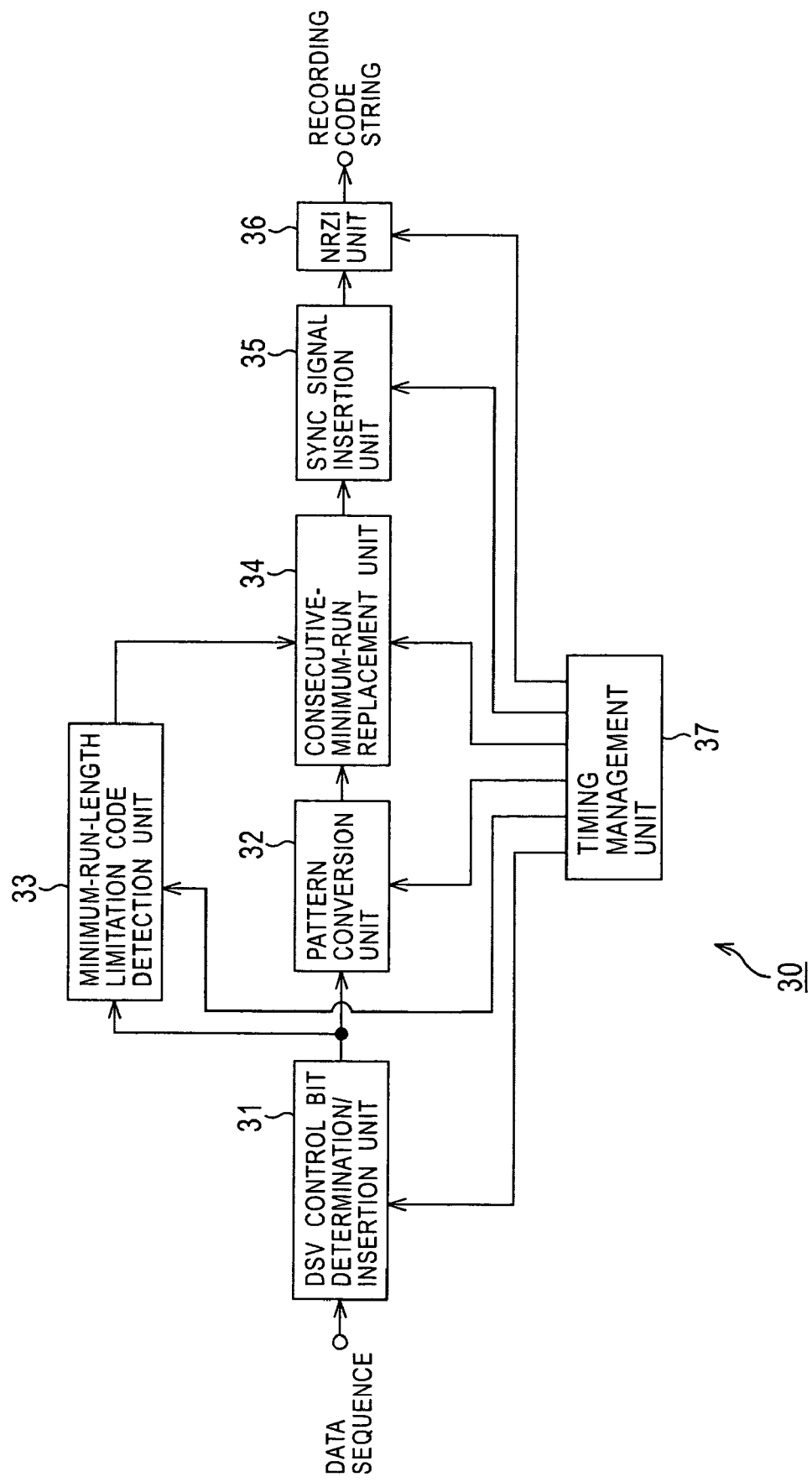
FIG. 3 is a block diagram showing an example structure of a modulation apparatus according to the present invention.

As shown in FIG. 3, a modulation apparatus 30 includes a DSV control bit determination and insertion unit 31 for determining "1" or "0", serving as a DSV control bit, and for inserting the DSV control bit into an input data sequence at arbitrary intervals; a pattern conversion unit 32 for converting the data sequence containing the determined DSV control bit into a channel bit using a predetermined conversion table; a minimum-run-length limitation code detection unit 33 for detecting, from the data sequence containing the DSV control bit, the position of minimum runs consecutive from the channel bit string converted by the pattern conversion unit 32 and for outputting the resulting position information; a consecutive-minimum-run replacement unit 34 for replacing a predetermined portion of the channel bit string supplied from the pattern conversion unit 32 for a predetermined pattern based on the position information supplied from the minimum-run-length limitation code detection unit 33 to limit the minimum run length to a predetermined number or less; a sync signal insertion unit 35 for inserting a synchronization signal at a predetermined position of the channel bit string supplied from the consecutive-minimum-run replacement unit 34; and an NRZI unit 36 for converting the output of the sync signal insertion unit 35 into a recording waveform string. The modulation apparatus 30 further includes a timing management unit 37 for generating a timing signal and supplying the timing signal to the DSV control bit determination and insertion unit 31, the pattern conversion unit 32, the minimum-run-length limitation code detection unit 33, the consecutive-minimum-run replacement unit 34, the sync signal insertion unit 35, and the NRZI unit 36 to manage the timing.

Figure 4:
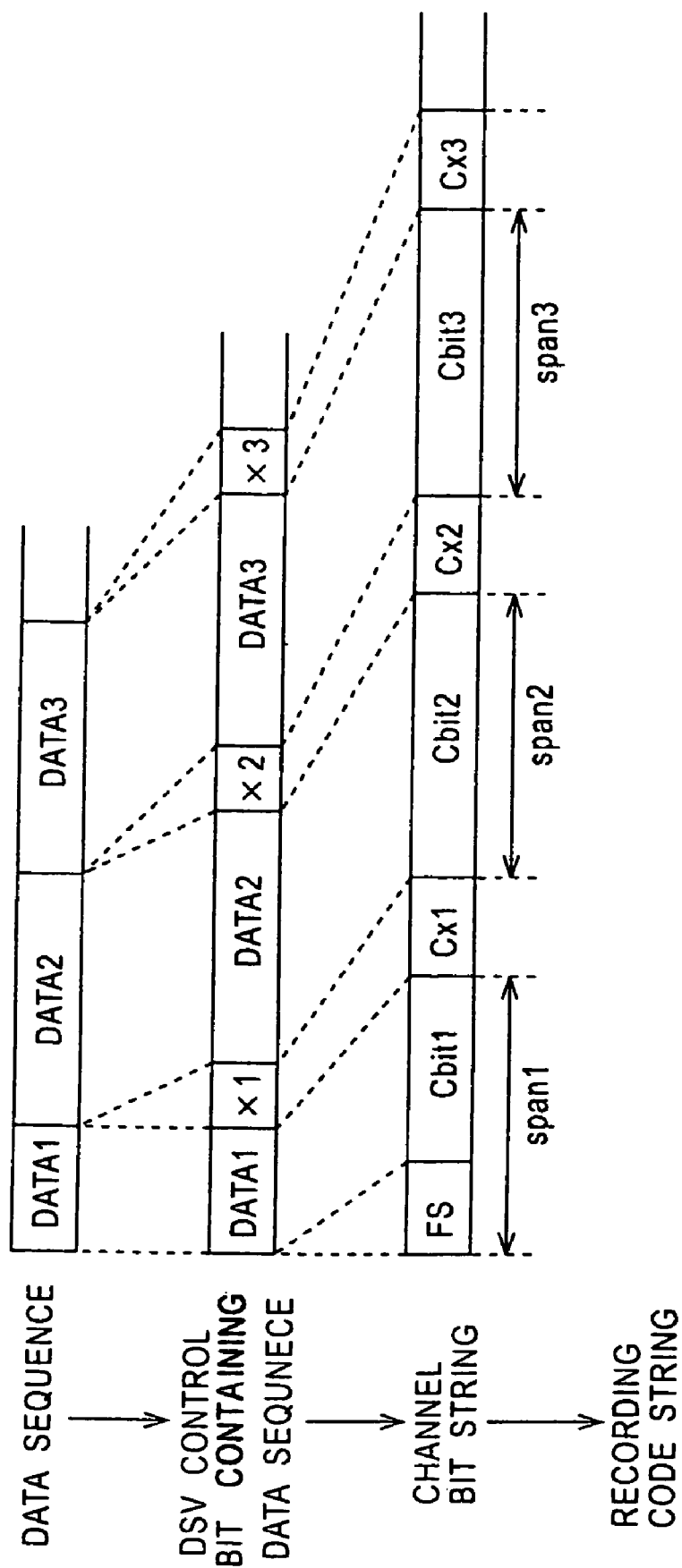
FIG. 4 is a diagram illustrating processing of the modulation apparatus shown in FIG. 1.

FIG. 4 is a diagram illustrating processing of the modulation apparatus 30 shown in FIG. 3. The DSV control bit determination and insertion unit 31 determines and inserts a DSV control bit into a data sequence at arbitrary intervals for each DSV period at which DSV is determined. In FIG. 4, the DSV period corresponds to DATA 1, DATA 2, or DATA 3 each having an arbitrary length. As shown in FIG. 4, the DSV control bit determination and insertion unit 31 determines DSV up to DATA 1, in order to first insert a DSV control bit between DATA 1 and DATA 2 of the input data word. DSV is the sum of the values of level-coded (NRZI-modulated) channel bit string, into which DATA 1 is converted, by allocating +1 to the level set to level H (1) and −1 to the level set to level L (0). The sectional DSV for the next period, i.e., DATA 2, is determined in a similar way. Then, a DSV control bit x1 to be inserted between DATA 1 and DATA 2 is determined so that the absolute values of DSV of DATA 1, the DSV control bit x1, and DATA 2 are close to "zero".

If the DSV control bit x1 is set to (1), the level code of DATA 2 subsequent to DATA 1 is inverted. If the DSV control bit x1 is set to (0), the level code of DATA 2 subsequent to DATA 1 is not inverted. Since Table 2 described above is designed so that the remainder of the number of "1's" in each element of the data sequence divided by two and the remainder of the number of "1's" in each element of the converted codeword string divided by two are equally 1 or 0, insertion of (1) into the data sequence corresponds to insertion of "1" into the converted codeword string (in other words, "inversion").

After determining the DSV control bit x1 shown in FIG. 4, a DSV control bit x2 is inserted between DATA 2 and DATA 3 at a predetermined data interval to perform DSV control in a similar way. The DSV at this time is the DSV of DATA 1, x1, and DATA 2.

DATA 1 contains a frame synchronization signal (hereinafter referred to as an FS (Frame Sync)) for synchronization between frames. Thus, DATA 1, which is a DSV period at which the DSV control bit is inserted, has a short duration. The duration of DATA 1 is defined so that a span 1 of the DSV period indicating the converted channel bit string including the FS and a channel bit Cbit1 corresponding to DATA 1, a span 2 of the DSV period including a channel bit Cbit2 corresponding to DATA 2, and a span 3 of the DSV period including a channel bit Cbit3 corresponding to DATA 3 have the same length (span 1=span 2=span 3). Assuming that the FS has FS (bits) and both DATA 2 and DATA 3 have y (bits), the conversion ratio for the conversion table is expressed as m:n=2:3. Therefore, DATA 1 has y-FS*⅔ (bits). After conversion into the channel bit string, the DSV control bits become longer by the conversion ratio, and the DSV control bits x1, x2, and x3 are changed to Cx1, Cx2, and Cx3, respectively.

In the channel bit string (NRZI-modulated recording code string), the FS is followed by the DSV control bits at equal intervals, thereby achieving DSV control.

Figure 5:
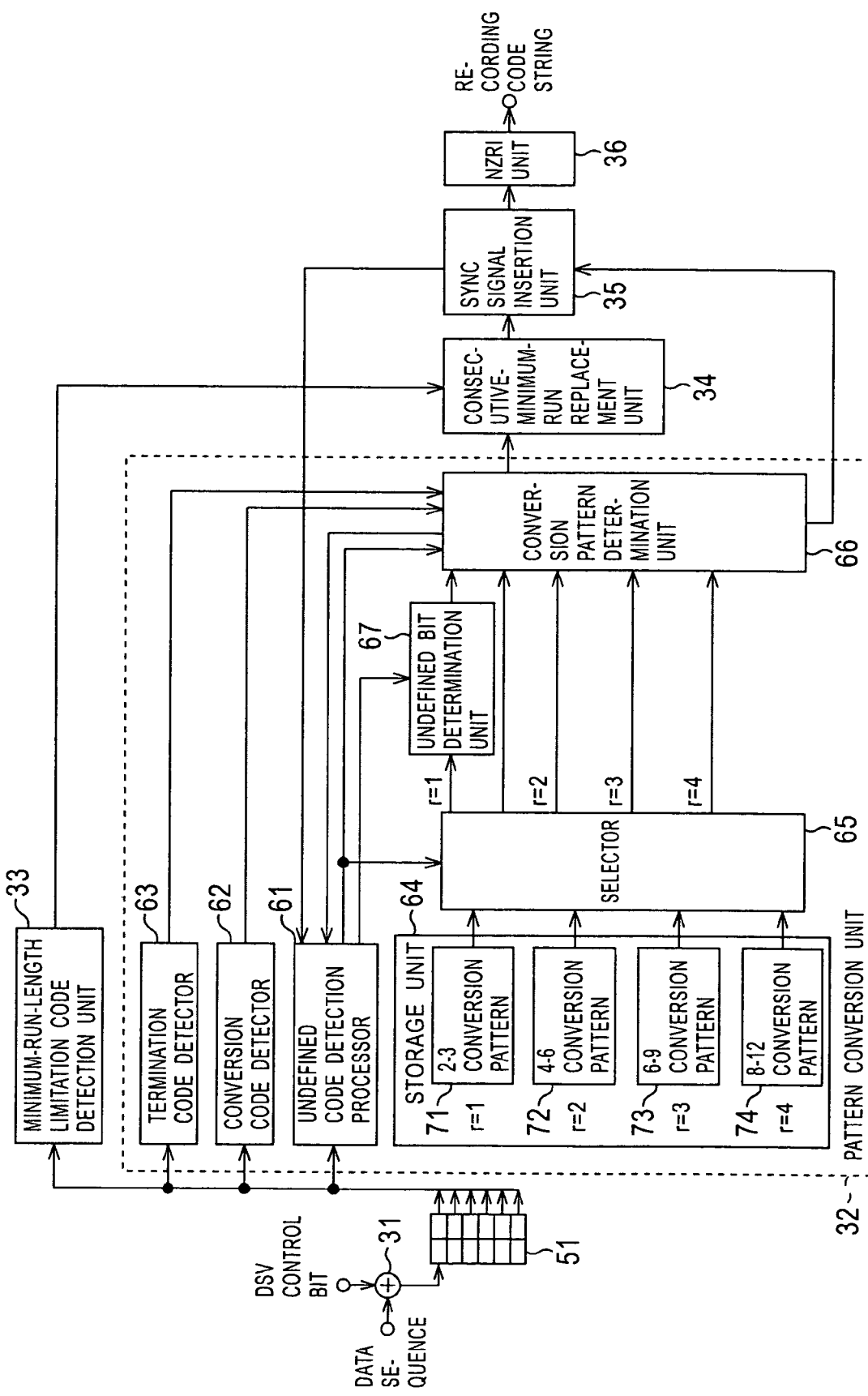
FIG. 5 is a block diagram showing a detailed example structure of the modulation apparatus.

FIG. 5 is a block diagram showing a detailed example structure of the modulation apparatus 30. In FIG. 5, the DSV control bit determination and insertion unit 31 inserts a DSV control bit into an input data sequence, and supplies the resulting data to a shift register 51.

The shift register 51 shifts the data by 2 bits, and supplies the data to the minimum-run-length limitation code detection unit 33, and an undefined code detection processor 61, a conversion code detector 62, and a termination code detector 63 which are contained in the pattern conversion unit 32. The shift register 51 supplies to these components bits necessary for the components to perform the respective processing.

The minimum-run-length limitation code detection unit 33 detects the (110111) pattern shown in Table 2 from the input data. The minimum-run-length limitation code detection unit 33 has a data sequence of predetermined bits stored therein in advance. When the (110111) pattern is detected from the input data, the minimum-run-length limitation code detection unit 33 further checks the following input data sequence. If the (110111) pattern is followed by (01), (001), or (00000), or if the (110111) pattern is followed by (0000) and the input data terminates here, the minimum-run-length limitation code detection unit 33 determines that the minimum-run-length limitation code is detected, and supplies this information to the consecutive-minimum-run replacement unit 34.

Conversely, if (01), (001), or (00000) is detected from the input data, or if (0000) is detected from the input data and the input data terminates here, the minimum-run-length limitation code detection unit 33 having a data sequence of predetermined bits stored therein in advance may check the previous six data bits to the detected pattern in the input data sequence, and, if the checked data bits are (110111), the minimum-run-length limitation code detection unit 33 may determine that the minimum-run-length limitation code is detected, and may supply this information to the consecutive-minimum-run replacement unit 34.

The undefined code detection processor 61 detects (11) for the constraint length r=1 shown in Table 2 from the input data. When the input data includes (11), the undefined code detection processor 61 supplies this information to a selector 65 and a conversion pattern determination unit 66. Then, the undefined code detection processor 61 acquires information indicating the last channel bit of the previous pattern from the conversion pattern determination unit 66 or the sync signal insertion unit 35 (thus, in the modulation apparatus 30, the information indicating the last channel bit of the previous pattern is fed back to the undefined code detection processor 61). The undefined code detection processor 61 supplies this information to an undefined bit determination unit 67, so that the undefined bit determination unit 67 determines that the detected pattern is to be converted into "101" when the last channel bit is 0 and "000" when the last channel bit is 1.

The conversion code detector 62 detects other patterns than (11) and (110111) in the portions other than the termination table shown in Table 2. When the data sequence pattern is detected for each of the constraint lengths r=1 through r=4, the conversion code detector 62 supplies this information to the conversion pattern determination unit 66.

The termination code detector 63 detects the termination code pattern in the termination table shown in Table 2. Specifically, if (00), (0000), (000010), or (000000) is detected from the input data and it is determined that information given by an internal termination position counter indicates the termination position, the termination code detector 63 determines that the termination code is detected, and supplies this information to the conversion pattern determination unit 66. In the modulation apparatus 30, therefore, the termination position is determined from the data supplied from the shift register 51, that is, the DSV-control-bit-containing data sequence.

In FIG. 5, the pattern conversion unit 32 includes, in addition to the above-noted undefined code detection processor 61, conversion code detector 62, and termination code detector 63, a storage unit 64 for storing conversion patterns for the constraint lengths r=1 through r=4, the selector 65 for selecting a conversion pattern to be used, the conversion pattern determination unit 66 for converting the input data into channel bits, and the undefined bit determination unit 67 for determining undefined bits of the channel bit string.

The storage unit 64 stores a 2-3 conversion pattern 71 indicating the conversion pattern for the constraint length r=1, a 4-6 conversion pattern 72 indicating the conversion pattern for the constraint length r=2, a 6-9 conversion pattern 73 indicating the conversion pattern for the constraint length r=3, and an 8-12 conversion pattern 74 indicating the conversion pattern for the constraint length r=4 of the conversion table shown in Table 2, and supplies these patterns to the selector 65.

The 2-3 conversion pattern 71, the 4-6 conversion pattern 72, the 6-9 conversion pattern 73, and the 8-12 conversion pattern 74 may have a different structure from the structure of the correspondence table between the data sequence and the channel bit string shown in Table 2 if the information supplied from the undefined code detection processor 61, the conversion code detector 62, the termination code detector 63, or the minimum-run-length limitation code detection unit 33 includes information for individually identifying the elements of the table, for example, information containing identification information having a one-to-one correspondence with the converted channel bit string.

The selector 65 selects and obtains a conversion pattern, to be used, from the 2-3 conversion pattern 71, 4-6 conversion pattern 72, 6-9 conversion pattern 73, and 8-12 conversion pattern 74 stored in the storage unit 64 based on the information supplied from the undefined code detection processor 61, and supplies the selected pattern to the conversion pattern determination unit 66. When the undefined code detection processor 61 detects (11) from the input data, the selector 65 supplies the 2-3 conversion pattern 71 to the undefined bit determination unit 67.

The conversion pattern determination unit 66 selects conversion code, to be used, from the conversion patterns supplied from the selector 65 or the undefined bit determination unit 67 based on the information acquired from the undefined code detection processor 61, the conversion code detector 62, and the termination code detector 63, and supplies the selected code to the consecutive-minimum-run replacement unit 34. The conversion pattern determination unit 66 also supplies information indicating the last channel bit of the determined conversion pattern to the undefined code detection processor 61. When the sync signal insertion unit 35 inserts a synchronization signal into a predetermined position of the channel bit string, the conversion pattern determination unit 66 supplies to the sync signal insertion unit 35, if necessary, termination processing information indicating whether or not the termination table was used.

The undefined bit determination unit 67 determines an undefined code of the 2-3 conversion pattern 71 supplied from the selector 65 based on the information supplied from the undefined code detection processor 61, and supplies this information to the conversion pattern determination unit 66.

In the channel bit string output from the pattern conversion unit 32, the minimum run length is not limited. The minimum run length is limited by the consecutive-minimum-run replacement unit 34.

The consecutive-minimum-run replacement unit 34 replaces a particular portion of the channel bit string supplied from the conversion pattern determination unit 66 based on the information supplied from the minimum-run-length limitation code detection unit 33, and limits the minimum run length. Then, the consecutive-minimum-run replacement unit 34 supplies the channel bit string, whose minimum run length is limited, to the sync signal insertion unit 35.

The sync signal insertion unit 35 inserts a synchronization signal containing a unique pattern, which does not exist as a conversion code of the conversion table, into the channel bit string supplied from the consecutive-minimum-run replacement unit 34. The sync signal insertion unit 35 interrupts input of the channel bit string at predetermined intervals to insert a synchronization signal pattern. The synchronization signal pattern inserted in the channel bit string by the sync signal insertion unit 35 has a channel bit string format distinguishable from other patterns. The synchronization signal pattern is determined by referring to the termination processing information supplied, if necessary, from the conversion pattern determination unit 66. The sync signal insertion unit 35 inserts the synchronization signal into the channel bit string, and supplies the channel bit string containing the synchronization signal to the NRZI unit 36. The sync signal insertion unit 35 also supplies information indicating the last channel bit of the synchronization signal inserted in the channel bit string to the undefined code detection processor 61.

The termination processing information is supplied from the conversion pattern determination unit 66 to the sync signal insertion unit 35 when the termination pattern (00) or (0000) of the termination table shown in Table 2 is detected from the data sequence. For compatibility in demodulation, the sync signal insertion unit 35 determines whether or not the termination table is used to convert the data sequence into the channel bit string, and inserts a synchronization signal.

For example, the start channel bit of the synchronization signal is a termination table identification bit, where the termination table identification bit is set to 1 when the termination table is used and is set to 0 when a standard table is used. Thus, it is determined whether or not the termination table is used to convert the data sequence into the channel bit string.

The NRZI unit 36 NRZI-modulates the channel bit string supplied from the sync signal insertion unit 35 to rearrange the channel bit string, in which 1 is inverted and 0 is not inverted, to generate a recording code string. In other words, the channel bit string which has not been NRZI-modulated is a bit string indicating the position of the edges of the NRZI-modulated recording code string, and the NRZI-modulated recording code string corresponds to a bit string indicating the H or L level of recorded data.

In the foregoing description, the undefined bit determination unit 67 is provided only for the constraint length r=1; however, the present invention is not limited thereto. For example, as shown in FIG. 6, undefined bit determination units may be provided for the other constraint lengths.

Figure 6:
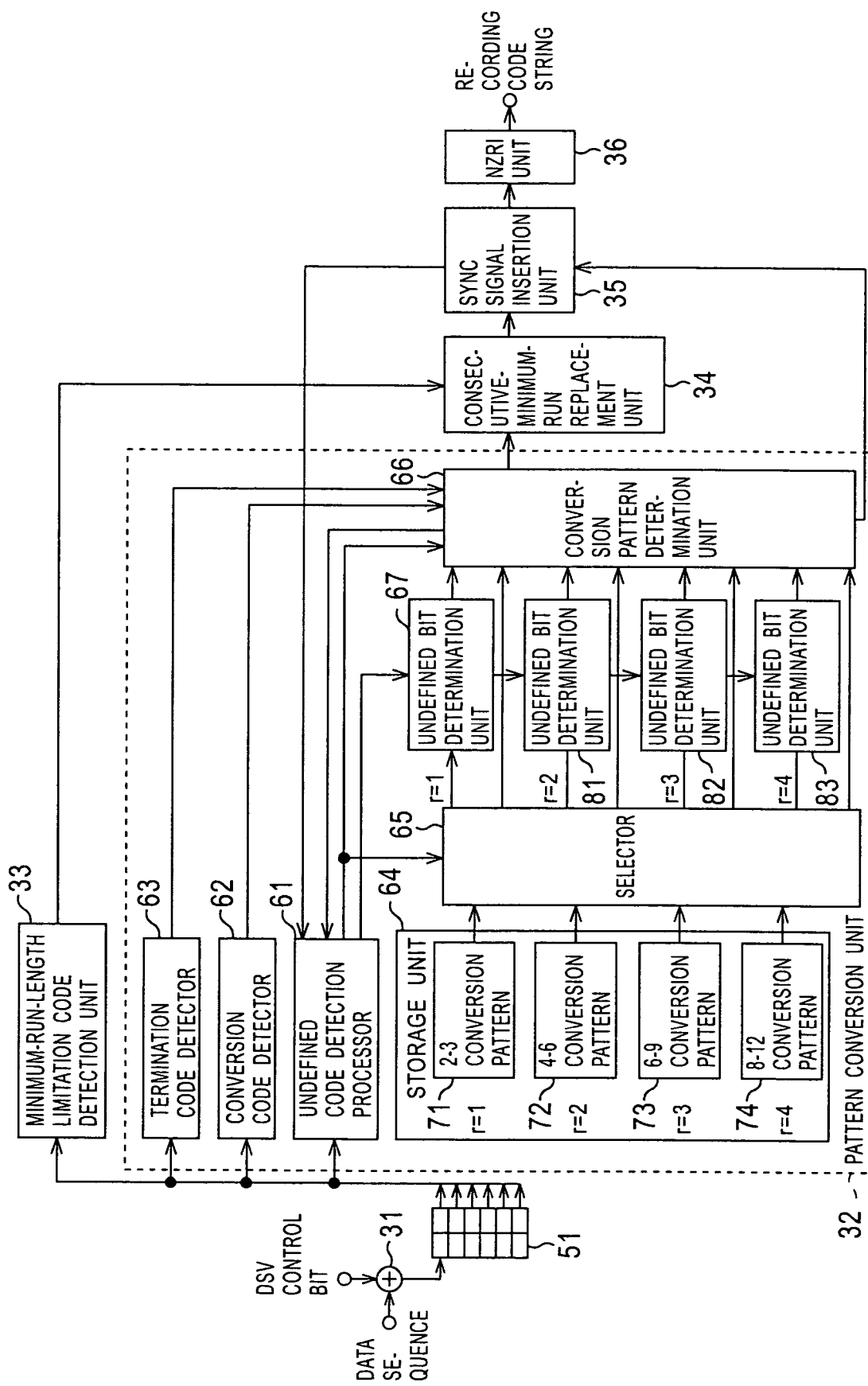
FIG. 6 is a block diagram showing another detailed example structure of the modulation apparatus.

FIG. 6 is a block diagram showing another detailed example structure of the modulation apparatus 30.

In FIG. 6, the undefined bit determination unit 67 is provided for the constraint length r=1, an undefined bit determination unit 81 is provided for the constraint length r=2, an undefined bit determination unit 82 is provided for the constraint length r=3, and an undefined bit determination unit 83 is provided for the constraint length r=4. This enables the modulation apparatus 30 to determine undefined bits if the conversion table shown in Table 2 contains undefined codes for all the constraint lengths r=1, r=2, r=3, and r=4.

Next, the operation of the modulation apparatus 30 according to the embodiment described with reference to FIG. 5 is described.

First, the DSV control bit determination and insertion unit 31 inserts a DSV control bit into the input data sequence, and supplies the resulting data to the shift register 51.

Figure 7:
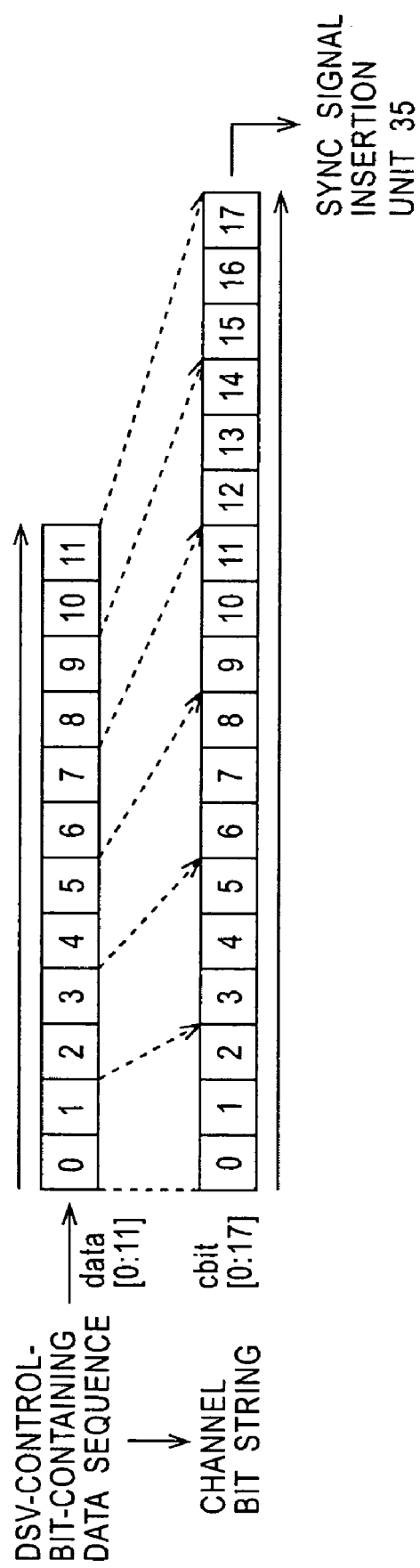
FIG. 7 is a schematic diagram showing a register mechanism for converting an input data sequence to a channel bit string.

FIG. 7 is a schematic diagram showing a register mechanism for converting an input data sequence into a channel bit string. FIG. 7 illustrates a register mechanism essential to conversion of a data sequence into a channel bit string in accordance with Table 2 described above. The register mechanism includes a 12-bit register of data [0:11] for storing the unconverted data sequence containing DSV control bits, and an 18-bit register of cbit [0:17] for storing the converted channel bit string from the pattern conversion unit 32. The register mechanism further includes a timing register, etc.

Referring back to FIG. 5, data of bits necessary for detection, etc., is supplied in units of 2 bits from the shift register 51 to each of the undefined code detection processor 61, conversion code detector 62, and termination code detector 63 of the pattern conversion unit 32, and to the minimum-run-length limitation code detection unit 33.

Figure 8:
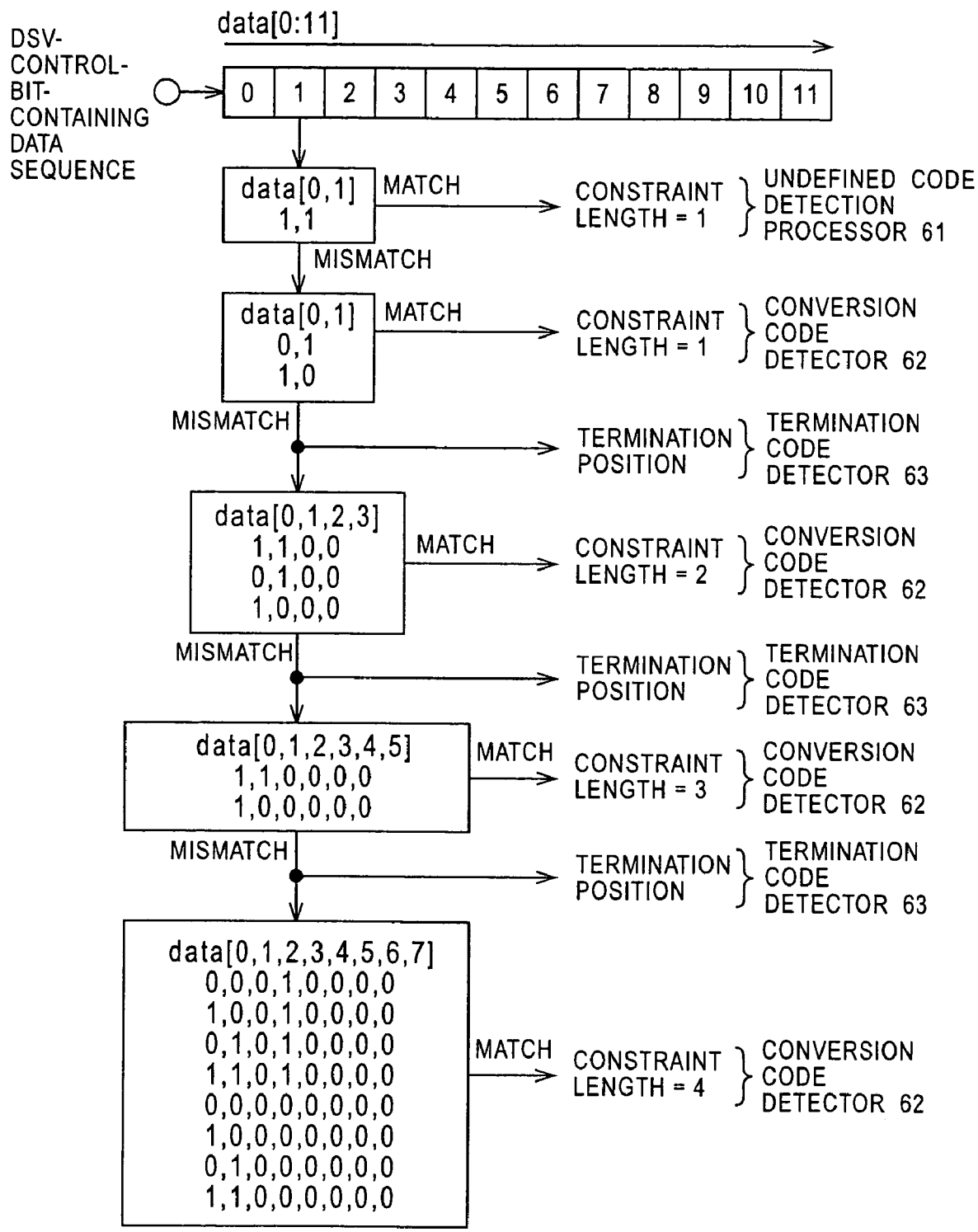
FIG. 8 is a diagram showing a specific example of the operation of an undefined code detection processor, conversion code detector, and termination code detector to which a DSV-control-bit-containing data sequence is supplied from a shift register.

FIG. 8 is a diagram showing a specific example of the operation of the undefined code detection processor 61, conversion code detector 62, and termination code detector 63 to which the DSV-control-bit-containing data sequence is supplied from the shift register 51.

In FIG. 8, the DSV-control-bit-containing data sequence is sequentially input to the 12-bit register of data [0:11], starting from the data [0], and is shifted towards the higher-numbered register elements at each clock. The data shifted up to the data [11] is discarded at the next shit operation.

When two data bits are input to the data [0, 1], the undefined code detection processor 61, the conversion code detector 62, and the termination code detector 63 refer to the data [0, 1]. If the data [0, 1]=[1, 1], the undefined code detection processor 61 which detects (11) operates in the manner described above, and supplies this information to the selector 65 and the conversion pattern determination unit 66. The undefined code detection processor 61 also supplies to the undefined bit determination unit 67 information for converting the detected pattern into "101" or "000" based on the last channel bit of the previous pattern obtained from the conversion pattern determination unit 66 or the sync signal insertion unit 35.

If the data [0, 1]=[0, 1] or if the data [0, 1]=[1, 0], the conversion code detector 62 which detects (10) or (01) supplies this information to the conversion pattern determination unit 66 so that the detected pattern is converted into "001" or "010" using the conversion code for the constraint length r=1 of the conversion table shown in Table 2.

If the data [0, 1]=[0, 0], the termination code detector 63 which detects (00) refers to the internal termination position counter, as described above. If it is determined that the information given by the termination position counter indicates the termination position, the termination code detector 63 supplies this information to the conversion pattern determination unit 66, so that the detected pattern is converted into "000" and terminates here.

If the information given by the internal termination position counter of the termination code detector 63 does not indicate the termination position, the pattern (00) is not converted for the constraint length r=1. If the conversion pattern is not yet determined when two data bits are input to the shift register 51, additional two data bits are input to the shift register 51.

When the additional two data bits (total four data bits) are input, the conversion code detector 62 and the termination code detector 63 refer to the data [0, 1, 2, 3]. If the data [0, 1, 2, 3]=[1, 1, 0, 0], the data [0, 1, 2, 3]=[0, 1, 0, 0], or the data [0, 1, 2, 3]=[1, 0, 0, 0], the conversion code detector 62 which detects (0011), (0010), or (0001) operates in the manner described above, and supplies the information to the conversion pattern determination unit 66, so that the detected pattern is converted into "010100", "010000", or "000100" using the conversion code for the constraint length r=2 of the conversion table shown in Table 2.

If the data [0, 1, 2, 3]=[0, 0, 0, 0], the termination code detector 63 which detects (0000) refers to the internal termination position counter, as described above. If it is determined that the information given by the termination position counter indicates the termination position, the termination code detector 63 supplies this information to the conversion pattern determination unit 66, so that the detected pattern is converted into "010100" and terminates here.

If the information given by the internal termination position counter of the termination code detector 63 does not indicate the termination position, the pattern (0000) is not converted for the constraint length r=2. If the conversion pattern is not yet determined when four data bits are input to the shift register 51, additional two data bits are input to the shift register 51.

For the constraint length r=2, only the data [0, 1] may be determined since it is already found for the constraint length r=1 that the data [2, 3]=[0, 0].

When the additional two data bits (total six data bits) are input, the conversion code detector 62 and the termination code detector 63 refer to the data [0, 1, 2, 3, 4, 5]. If the data [0, 1, 2, 3, 4, 5]=[1, 1, 0, 0, 0, 0] or if the data [0, 1, 2, 3, 4, 5]=[1, 0, 0, 0, 0, 0], the conversion code detector 62 which detects (000011) or (000001) operates in the manner described above, and supplies the information to the conversion pattern determination unit 66, so that the detected pattern is converted into "000100100" or "010100100" using the conversion code for the constraint length r=3 of the conversion table shown in Table 2.

If the data [0, 1, 2, 3, 4, 5]=[0, 0, 0, 0, 0, 0] or if the data [0, 1, 2, 3, 4, 5]=[0, 1, 0, 0, 0, 0], the termination code detector 63 which detects (000000) or (000010) refers to the internal termination position counter, as described above. If it is determined that the information given by the termination position counter indicates the termination position, the termination code detector 63 supplies this information to the conversion pattern determination unit 66, so that the detected pattern is converted into "010100000" or "000100000" and terminates here.

If the information given by the internal termination position counter of the termination code detector 63 does not indicate the termination position, the pattern (000000) or (000010) is not converted for the constraint length r=3. If the conversion pattern is not yet determined when six data bits are input to the shift register 51, additional two data bits are input to the shift register 51.

For the constraint length r=3, only the data [0, 1] may be determined since it is already found for the constraint length r=2 that the data [2, 3, 4, 5]=[0, 0, 0, 0].

When the additional two data bits (total eight data bits) are input, the conversion code detector 62 refers to the data [0, 1, 2, 3, 4, 5, 6, 7]. If the data [0, 1, 2, 3, 4, 5, 6, 7]=[0, 0, 0, 0, 0, 0, 0, 0], the data [0, 1, 2, 3, 4, 5, 6, 7]=[1, 0, 0, 0, 0, 0, 0, 0], the data [0, 1, 2, 3, 4, 5, 6, 7]=[0, 1, 0, 0, 0, 0, 0, 0], or the data [0, 1, 2, 3, 4, 5, 6, 7]=[1, 1, 0, 0, 0, 0, 0, 0], or, otherwise, if the data [0, 1, 2, 3, 4, 5, 6, 7]=[0, 0, 0, 1, 0, 0, 0, 0], the data [0, 1, 2, 3, 4, 5, 6, 7]=[1, 0, 0, 1, 0, 0, 0, 0], the data [0, 1, 2, 3, 4, 5, 6, 7]=[0, 1, 0, 1, 0, 0, 0, 0], or the data [0, 1, 2, 3, 4, 5, 6, 7]=[1, 1, 0, 1, 0, 0, 0, 0], the conversion code detector 62 which detects (00000000), (00000001), (00000010), or (00000011), or, otherwise, (00001000), (00001001), (00001010), or (00001011) operates in the manner described above, and supplies the information to the conversion pattern determination unit 66, so that the detected pattern is converted into "010100100100", "010100000010", "010100000001", or "010100000101", or, otherwise, "000100100100", "000100000010", "000100000001", or "000100000101" using the conversion code for the constraint length r=4 of the conversion table shown in table 2.

For the constraint length r=4, only the data [0, 1, 2, 3] may be determined since it is already found for the constraint length r=2 that the data [4, 5, 6, 7]=[0, 0, 0, 0].

The input DSV-control-bit-containing data sequence is converted into a channel bit string in the way described above. The next pattern conversion is carried out by, after determining a pattern, returning and repeating the operation for a constraint length of 1. As shown in FIG. 7, data conversion is completed before the channel bit string is supplied from the 18-bit register. The converted channel bit string is supplied to the sync signal insertion 35.

The minimum-run-length limitation code detection unit 33 refers to the shift register 51, to which the DSV-control-bit-containing data sequence is input, to detect a minimum-run-length limitation code.

Figure 9:
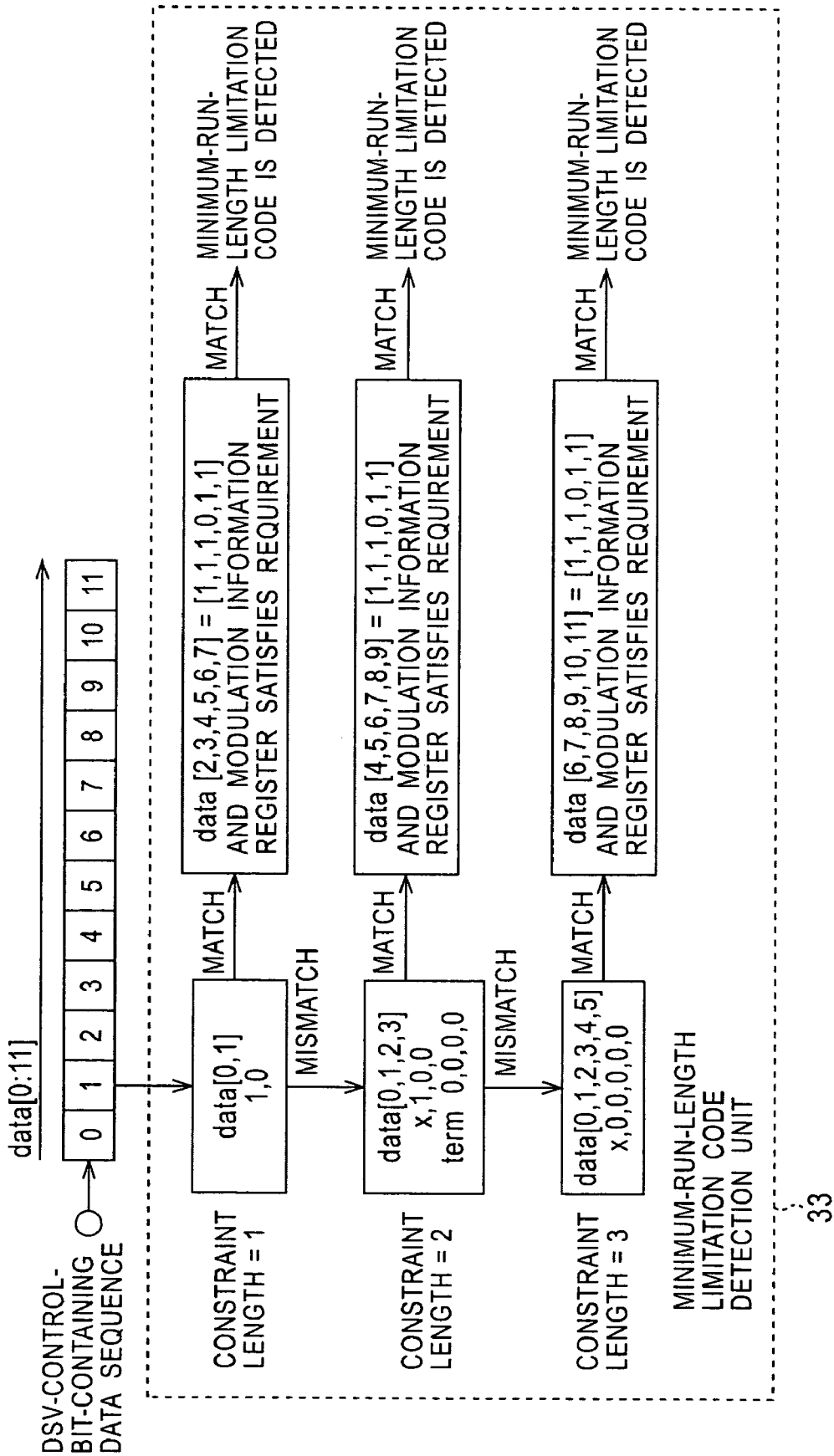
FIG. 9 is a diagram showing a specific example of the operation of a minimum-run-length limitation code detection unit for detecting a minimum-run-length limitation code from a data sequence.

FIG. 9 is a diagram showing a specific example of the operation of the minimum-run-length limitation code detection unit 33 for detecting a minimum-run-length limitation code from the data sequence.

In FIG. 9, like the operation shown in FIG. 8, the DSV-control-bit-containing data sequence is sequentially input to the register of data [0:11], starting from the data [0], and is shifted towards the higher-numbered register elements at each clock. The data shifted up to the data [11] is discarded at the next shift operation.

Before the minimum-run-length limitation code detection unit 33 refers to the register of data [0:11], pattern conversion of the data sequence into the channel bit string is carried out one time in the manner shown in FIG. 8, and the converted channel bit string is stored in the register of the channel bit string cbit [0:17] shown in FIG. 7.

For the constraint length r=1, if the data [0, 1]=[1, 0], whose previous six data bits are represented by the data (2, 3, 4, 5, 6, 7]=[1, 1, 1, 0, 1, 1], and a modulation information register meets conditions, that is, if (01) is detected, the previous six data bits thereto being (110111), and the modulation information register meets the conditions, then, the minimum-run-length limitation code detection unit 33 determines that the minimum-run-length limitation code is detected. This information is supplied to the consecutive-minimum-run replacement unit 34.

For the constraint length r=2, if the data [0, 1, 2, 3]=[0, 1, 0, 0] or the data [0, 1, 2, 3]=[1, 1, 0, 0], whose previous six data bits are represented by the data [4, 5, 6, 7, 8, 9]=[1, 1, 1, 0, 1, 1], and the modulation information register meets the conditions, that is, if (0010) or (0011) is detected, the previous six data bits thereto being (110111), and the modulation information register meets the conditions, then, the minimum-run-length limitation code detection unit 33 determines that the minimum-run-length limitation code is detected. This information is supplied to the consecutive-minimum-run replacement unit 34.

For the constraint length r=2, if the data [0, 1, 2, 3]=[0, 0, 0, 0], indicating the termination position, whose previous six data bits are represented by the data [4, 5, 6, 7, 8, 9]=[1, 1, 1, 0, 1, 1], and the modulation information register meets the conditions, that is, if the termination position terminating at (0000) is detected, the previous six data bits thereto being (110111), and the modulation information register meets the conditions, then, the minimum-run-length limitation code detection unit 33 determines that the minimum-run-length limitation code is detected. This information is supplied to the consecutive-minimum-run replacement unit 34.

For the constraint length r=3, if the data [0, 1, 2, 3, 4, 5]=[0, 0, 0, 0, 0, 0] or the data [0, 1, 2, 3, 4, 5]=[1, 0, 0, 0, 0, 0], whose previous six data bits are represented by the data [6, 7, 8, 9, 10, 11]=[1, 1, 1, 0, 1, 1], and the modulation information register meets the conditions, that is, if (000000) or (000001) is detected, the previous six data bits thereto being (110111), and the modulation information register meets the conditions, then, the minimum-run-length limitation code detection unit 33 determines that the minimum-run-length limitation code is detected. This information is supplied to the consecutive-minimum-run replacement unit 34.

The consecutive-minimum-run replacement unit 34 replaces the channel bit string for a predetermined channel bit string based on the information supplied from the minimum-run-length limitation code detection unit 33. If the data [2, 3, 4, 5, 6, 7]=[1, 1, 1, 0, 1, 1], i.e., if the minimum-run-length limitation code is detected for the constraint length r=1, the replaced channel bit string is cbit [3, 4, 5, 6, 7, 8, 9, 10, 11]. If the data [4, 5, 6, 7, 8, 9]=[1, 1, 1, 0, 1, 1], i.e., if the minimum-run-length limitation code is detected for the constraint length r=2, the replaced channel bit string is cbit [6, 7, 8, 9, 10, 11, 12, 13, 14]. Likewise, if the data [6, 7, 8, 9, 10, 11]=[1, 1, 1, 0, 1, 1], i.e., if the minimum-run-length limitation code is detected for the constraint length r=3, the replaced channel bit string is cbit [9, 10, 11, 12, 13, 14, 15, 16, 17].

Accordingly, a channel bit string is replaced by another channel bit string. No additional register is required for replacement, and the modulation apparatus 30 has a simple structure. As shown in FIG. 7, the channel bit string is replaced before it is supplied from the 18-bit register. The replaced channel bit string is supplied to the sync signal insertion unit 35.

Figure 10:
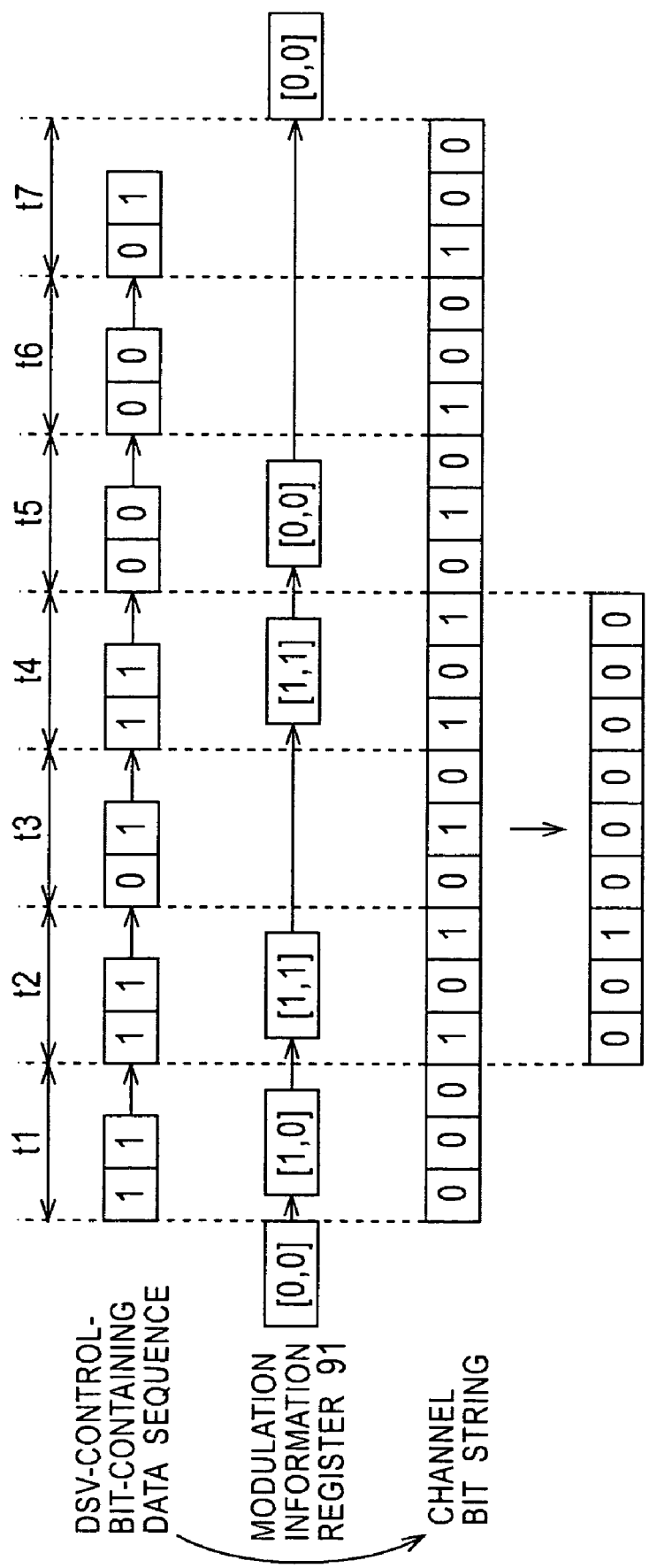
FIG. 10 is a diagram showing the detailed operation of the minimum-run-length limitation code detection unit which refers to a modulation information register to detect a minimum-run-length limitation code.

The detailed operation of the minimum-run-length limitation code detection unit 33 is described with reference to FIG. 10. FIG. 10 is a diagram illustrating the detailed operation of the minimum-run-length limitation code detection unit 33 which refers to the modulation information register to detect a minimum-run-length limitation code.

In FIG. 10, a DSV-control-bit-containing data sequence is sequentially input to the register, of which two data bits are converted into three channel bits by the pattern conversion unit 32. The DSV-control-bit-containing data sequence is checked and subjected to pattern conversion in units of two data bits in the order of t1, t2, t3, t4, t5, t6, and t7, and is converted into a channel bit string. If the pattern conversion unit 32 is not able to convert the DSV-control-bit-containing data sequence into a channel bit string, an additional DSV-control-bit-containing data sequence is input, and is checked and subjected to pattern conversion in units of two data bits (four data bits, six data bits, and eight data bits are checked and subjected to pattern conversion) in a sequential manner, as described above.

A modulation information register 91 stores 2-bit data. Data is input bit-by-bit, and a given data bit is shifted when the subsequent data bit is input. If (11) is detected from the DSV-control-bit-containing data sequence and the detected pattern is converted into "*0*", data set to "1" is input to the modulation information register 91, and the previous data bit is shifted. If (11) is detected and the detected pattern is not converted into "*0*", data set to "0" is input to the modulation information register 91, and the previous data bit is shifted.

If both 2 bits stored in the modulation information register 91 are "1", or neither of the 2 bits is input with "0", the minimum-run-length code detection limitation unit 33 determines that the modulation information register 91 meets conditions. The length minimum-run replacement unit 34 replaces the channel bit string, and the 2 bits stored in the conversion information register 91 are cleared to become "0".

In FIG. 10, for example, if (11) is detected during t1 from the DSV-control-bit-containing data sequence, (11) is converted into the channel bit string "000", as described above. At this time, data set to "1" is input to the modulation information register 91 having initial values [0, 0], and the modulation information register 91 has [1, 0]. During t2, (11) is detected from the DSV-control-bit-containing data sequence, and (11) is converted into the channel bit string "101", as described above. At this time, data set to "1" is input to the modulation information register 91, and the data input during t1 is shifted. Thus, the modulation information register 91 has [1, 1].

During t3, (01) is detected from the DSV-control-bit-containing data sequence, and (01) is converted into "010". At this time, no additional data is input to the modulation information register 91, and the modulation information register 91 still has [1, 1]. During t4, (11) is detected from the DSV-control-bit-containing data sequence, and (11) is converted into "101". Thus, data set to "1" is input to the modulation information register 91, and the data input during t1 is shifted. Thus, the modulation information register 91 has [1, 1].

During t5, (00) is detected from the DSV-control-bit-containing data sequence. As described above, (00) is not converted, and t5 transitions to t6. During t6, (00) is also detected, and t6 transitions to t7. During t7, (01) is detected, and (000001) is converted into "010100100". At this time, no additional data is input to the modulation information register 91, and the modulation information register 91 maintains the previous values. As shown in FIG. 9, the minimum-run-length limitation code detection unit 33 detects (000001) and the previous six data bits which are (110111). Since the modulation information register 91 has [1, 1] when the previous six data bits (110111) are detected, the minimum-run-length limitation code detection unit 33 determines that the minimum-run-length limitation code is detected. The consecutive-minimum-run replacement unit 34 performs channel-bit-string replacement to replace the channel bit string "101010101" from t2 to t4 for "001000000".

After the replacement, in the modulation information register 91, the input data is cleared to become [0, 0].

Figure 11:
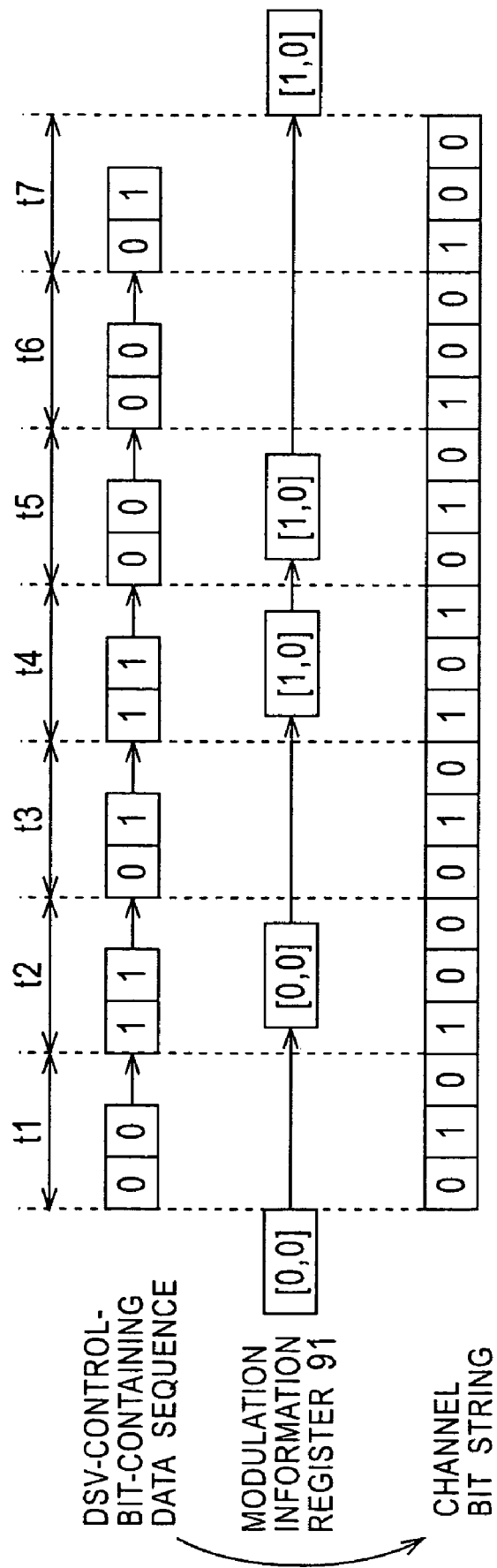
FIG. 11 is a diagram showing another example of the detailed operation of the minimum-run-length limitation code detection unit which refers to the modulation information register to detect a minimum-run-length limitation code.

FIG. 11 is a diagram showing another example of the detailed operation of the minimum-run-length limitation code detection unit 33 which refers to the modulation information register to detect a minimum-run-length limitation code.

In FIG. 11, if (00) is detected during t1 from the DSV-control-bit-containing data sequence, (00) is not converted, as described above, and t1 transitions to t2. During t2, (11) is detected from the DSV-control-bit-containing data sequence, and (0011) is converted into the channel bit string "010100". At this time, data set to "0" is input to the modulation information register 91 having initial values [0, 0], and the modulation information register 91 has [0, 0].

During t3, (01) is detected from the DSV-control-bit-containing data sequence, and (01) is converted into "010". At this time, no additional data is input to the modulation information register 91, and the modulation information register 91 maintains the previous values [0, 0]. During t4, (11) is detected from the DSV-control-bit-containing data sequence, and (11) is converted into "101". Thus, data set to "1" is input to the modulation information register 91, and the data input during t2 is shifted. Thus, the modulation information register 91 has [1, 0].

During t5, (00) is detected from the DSV-control-bit-containing data sequence. As described above, (00) is not converted, and t5 transitions to t6. During t6, (00) is also detected, and t6 transitions to t7. During t7, (01) is detected, and (000001) is converted into "010100100". At this time, no additional data is input to the modulation information register 91, and the modulation information register 91 maintains the previous values. As shown in FIG. 9, the minimum-run-length limitation code detection unit 33 detects (000001) and the previous six data bits which are (110111). Since the modulation information register 91 has [1, 0], the minimum-run-length limitation code detection unit 33 determines that the minimum-run-length limitation code is not detected. The consecutive-minimum-run replacement unit 34 does not replace the channel bit string.

In the way described above, the minimum-run-length limitation code detection unit 33 refers to the modulation information register 91 to detect a minimum-run-length limitation code.

This mechanism allows the modulation apparatus 30 to be simply structured. The minimum-run-length limitation code detection unit 33 and the consecutive-minimum-run replacement unit 34 are separate from the pattern conversion unit 32, and the modulation apparatus 30 is applicable to other systems having various specifications.

For example, in a case where the modulation apparatus 30 is applied to a system which does not require limitations on the minimum run length, the minimum-run-length limitation code detection unit 33 should be disconnected.

Distribution media for distributing to users a computer program for performing the foregoing processes may include recording media such as magnetic discs, CD-ROMs, and solid-state memory devices, and communication media such as networks and satellites.

INDUSTRIAL APPLICABILITY

According to the modulation apparatus and method of the present invention, therefore, a data sequence which is not converted for the constraint length r=3 is determined and converted for the constraint length r=4. Furthermore, a minimum-run-length limitation code detection unit and a consecutive-minimum-run replacement unit are separate from a pattern conversion unit. Thus, the modulation apparatus is realized with a simple circuit structure and is easily applicable to other systems.

The invention claimed is:

1. A modulation apparatus for converting data having a basic data length of m bits into variable-length code (d, k; m, n; r) having a basic code length of n bits, said modulation apparatus comprising:

conversion means for converting input data into codewords in accordance with a conversion table containing conversion codes having a coding rule that the remainder of the number of "1's" in each element of the data sequence divided by two and the remainder of the number of "1's" in each element of the converted codeword string divided by two are equally 1 or 0;

minimum-run-length limitation code detection means for detecting a minimum-run-length limitation code from the input data, the minimum-run-length limitation code being contained in the conversion codes of the conversion table and limiting the minimum run length to a predetermined number or less;

consecutive-minimum-run replacement means for replacing the codeword string converted by the conversion means so that the minimum run length is limited to the predetermined number or less based on the minimum-run-length limitation code detected by the minimum-run-length limitation code detection means; and modulation information storage means for counting the number of conversions performed by the conversion means based on a specified conversion code of the conversion codes contained in the conversion table and for storing information indicating the conversion count, wherein the minimum-run-length limitation code detection means is controlled to detect the minimum-run-length limitation code from the input data based on the information stored by the modulation information storage means.

2. A modulation apparatus according to claim 1, further comprising:

synchronization signal insertion means for inserting a synchronization signal containing a unique pattern, which does not exist as a conversion code of the conversion table, at an arbitrary position into the codeword string whose minimum run length is limited to the predetermined number or less by the consecutive-minimum-run replacement means; and NRZI conversion means for NRZI-converting the codeword string in which the synchronization signal is inserted by the sync signal insertion means to generate a recording code string.

3. A modulation apparatus according to claim 2, wherein the conversion means includes:

conversion code detection means for detecting a predetermined pattern from the input data, the predetermined pattern being contained in the conversion codes of the conversion table having a basic code wherein d=1, k=7, m=2, and n=3;

termination code detection means for detecting a termination code from the input data, the termination code being contained in the conversion codes of the conversion table and terminating a code at an arbitrary position;

undefined code detection means for detecting an undefined code from the input data, the undefined code being contained in the conversion codes of the conversion table and containing an undefined code including an undefined character having character "*0*" which becomes "000" or "101", where * denotes "0" if the previous or subsequent codeword is "1" and denotes "1" if the previous or subsequent codeword is "0";

undefined bit determination means for determining a value of the symbol * of the undefined character contained in the undefined code detected by the undefined code detection means; and conversion pattern determination means for determining the conversion code of the conversion table to be used, based on the detection results of the conversion code detection means, the termination code detection means, the undefined code detection means, and the value determined by the undefined bit determination means.

4. A modulation apparatus according to claim 3, wherein the termination code detection means includes a termination position counter which supplies information for specifying the termination position, and the termination code detection means detects a predetermined pattern contained in the conversion codes of the conversion table from the input data, and determines that the termination code is detected when the information supplied from the termination position counter indicates the termination position.

5. A modulation apparatus according to claim 3, wherein the undefined code detection means acquires information indicating the last bit of the conversion pattern determined by the conversion pattern determination means and information indicating the last bit of the pattern of the synchronization signal inserted by the synchronization signal insertion means, and the undefined bit determination means determines the value of the symbol * of the undefined character based on the information indicating the last bit of the conversion pattern and the information indicating the last bit of the pattern of the synchronization signal acquired by the undefined code detection means.

6. A modulation apparatus according to claim 3, wherein the conversion pattern determination means determines, based on the termination code, whether or not the conversion pattern in accordance with which the input data sequence is converted is determined, and the synchronization signal insertion means inserts the synchronization signal which is subjected to predetermined processing into the codeword string at an arbitrary position, based on the determination result of the conversion pattern determination means.

7. A modulation apparatus according to claim 6, wherein, in the predetermined processing, the start bit of the synchronization signal is set to "1" if the conversion pattern determination means determines, based on the termination code, that the conversion pattern is determined, and the start bit of the synchronization signal is set to "0" if the conversion pattern determination means determines, based on the termination code, that the conversion pattern is not determined.

8. A modulation method for a modulation apparatus for converting data having a basic data length of m bits into variable-length code (d, k; m, n; r) having a basic code length of n bits, said modulation method comprising:

a conversion step of converting input data into codewords in accordance with a conversion table containing conversion codes having a coding rule that the remainder of the number of "1's" in each element of the data sequence divided by two and the remainder of the number of "1's" in each element of the converted codeword string divided by two are equally 1 or 0;

a minimum-run-length limitation code detection step of detecting a minimum-run-length limitation code from the input data, the minimum-run-length limitation code being contained in the conversion codes of the conversion table and limiting the minimum run length to a predetermined number or less;

a consecutive-minimum-run replacement step of replacing the codeword string converted by performing the conversion step so that the minimum run length is limited to the predetermined number or less based on the minimum-run-length limitation code detected by performing the minimum-run-length limitation code detection step; and a modulation information storage step of counting the number of conversions performed in the conversion step based on a specified conversion code of the conversion codes contained in the conversion table and controlling storage of information indicating the conversion count, wherein, in the minimum-run-length limitation code detection step, detection of the minimum-run-length limitation code from the input data is controlled based on the information stored by performing the modulation information storage step.

9. A modulation method according to claim 8, further comprising:

a synchronization signal insertion step of inserting a synchronization signal containing a unique pattern, which does not exist as a conversion code of the conversion table, at an arbitrary position into the codeword string whose minimum run length is limited to the predetermined number or less by performing the consecutive-minimum-run replacement step; and an NRZI conversion step of NRZI-converting the codeword string in which the synchronization signal is inserted by performing the sync signal insertion step to generate a recording code string.

10. A modulation method according to claim 9, wherein the conversion step includes:

a conversion code detection step of detecting a predetermined pattern from the input data, the predetermined pattern being contained in the conversion codes of the conversion table having a basic code wherein d=1, k=7, m=2, n=3;

a termination code detection step of detecting a termination code from the input data, the termination code being contained in the conversion codes of the conversion table and terminating a code at an arbitrary position;

an undefined code detection step of detecting an undefined code from the input data, the undefined code being contained in the conversion codes of the conversion table and containing an undefined code including an defined character having character "*0*" which becomes "000" or "101", where * denotes "0" if the previous or subsequent codeword is "1" and denotes "1" if the previous or subsequent codeword is "0";

an undefined bit determination step of determining a value of the symbol * of the undefined character contained in the undefined code detected by performing the undefined code detection step; and a conversion pattern determination step of determining the conversion code of conversion table to be used, based on the detection results obtained by performing the conversion code detection step, the termination code detection step, and the undefined code detection step, and the value determined by performing the undefined bit determination step.

11. A modulation method according to claim 10, wherein the modulation apparatus includes a termination position counter which supplies information for specifying the termination position, and in the termination code detection step, a predetermined pattern contained in the conversion codes of the conversion table is detected from the input data, and it is determined that the termination code is detected when the information supplied from the termination position counter indicates the termination position.

12. A modulation method according to claim 10, wherein the undefined code detection step includes controlling acquisition of information indicating the last bit of the conversion pattern determined by performing the conversion pattern determination step and information indicating the last bit of the pattern of the synchronization signal inserted by performing the synchronization signal insertion step, and the undefined bit determination step includes determining the value of the symbol * of the undefined character based on the information indicating the last bit of the conversion pattern and the information indicating the last bit of the pattern of the synchronization signal acquired by performing the undefined code detection step.

13. A modulation method according to claim 10, wherein, in the conversion pattern determination step, it is determined, based on the termination code, whether or not the conversion pattern in accordance with which the input data sequence is converted is determined, and in the synchronization signal insertion step, the synchronization signal which is subjected to predetermined processing is inserted into the codeword string at an arbitrary position, based on the determination result obtained by performing the conversion pattern determination step.

14. A modulation method according to claim 13, wherein, in the predetermined processing, the start bit of the synchronization signal is set to "1" if the conversion pattern determination means determines, based on the termination code, that the conversion pattern is determined, and the start bit of the synchronization signal is set to "0" if the conversion pattern determination means determines, based on the termination code, that the conversion pattern is not determined.

15. A recording medium having a computer-readable program recorded therein, the program being adapted for a modulation apparatus for converting data having a basic data length of m bits into variable-length code (d, k; m, n; r) having a basic code length of n bits, the program including:

a conversion step of converting input data into codewords in accordance with a conversion table containing conversion codes having a coding rule that the remainder of the number of "1's" in each element of the data sequence divided by two and the remainder of the number of "1's" in each element of the converted codeword string divided by two are equally 1 or 0;

a minimum-run-length limitation code detection step of detecting a minimum-run-length limitation code from the input data, the minimum-run-length limitation code being contained in the conversion codes of the conversion table and limiting the minimum run length to a predetermined number or less;

wherein said minimum-run-length limitation code detection step further comprises detecting the minimum-run-length limitation code from the input data based on the information stored by performing the modulation information storage step;

a consecutive-minimum-run replacement step of replacing the codeword string converted by performing the conversion step so that the minimum run length is limited to the predetermined number or less based on the minimum-run-length limitation code detected by performing the minimum-run-length limitation code detection step; and a modulation information storage step of counting the number of conversions performed in the conversion step based on a specified conversion code of the conversion codes contained in the conversion table and for storing information indicating the conversion count.

* * * * *